(12) United States Patent
Wilson

(10) Patent No.: US 7,076,392 B1
(45) Date of Patent: Jul. 11, 2006

(54) TEST BIT-STREAM GENERATOR AND METHOD FOR DECODERS

(75) Inventor: Peter Brian Wilson, Waterbeach (GB)

(73) Assignee: ARM Limited, Cambridge (GB)

( * ) Notice: Subject to any disclaimer, the term of this patent is extended or adjusted under 35 U.S.C. 154(b) by 1007 days.

(21) Appl. No.: 09/680,334

(22) Filed: Oct. 6, 2000

(51) Int. Cl.
*G06F 19/00* (2006.01)

(52) U.S. Cl. .................. 702/119; 702/179; 706/16; 706/21; 706/50; 703/2; 370/506; 370/504

(58) Field of Classification Search ............... 702/117, 702/119, 120, 122, 124, 126, 181–183, 186, 702/189, FOR. 103, 104, 170, 171, 179, 702/134–135; 370/509, 506, 573, 504; 375/363, 375/247; 341/143, 63, 52–53, 54, 55; 714/757, 714/709, 791; 705/1, 7, 8, 50; 706/16, 21, 706/50; 703/2
See application file for complete search history.

(56) References Cited

U.S. PATENT DOCUMENTS

| | | | |
|---|---|---|---|
| 5,706,002 A * | 1/1998 | Meehan et al. | 341/67 |
| 5,731,839 A * | 3/1998 | Panaro | 348/416 |
| 6,400,400 B1 * | 6/2002 | Isnardi et al. | 348/180 |
| 6,510,247 B1 * | 1/2003 | Ordentlich et al. | 382/232 |

OTHER PUBLICATIONS

Settle et al., Digital Bit Stream Generator for Testing MPEG Video Decoders, Jun. 10, 1996, vol. 42, pp. 422-430.*
CRC, 'MPEG-4 Video Standard, Content-Based Video Coding', 2000 CRC press, pp. 1-26.*

* cited by examiner

*Primary Examiner*—Marc S. Hoff
*Assistant Examiner*—Elias Desta
(74) *Attorney, Agent, or Firm*—Nixon & Vanderhye P.C.

(57) ABSTRACT

The present invention provides a test bitstream generator and method for generating test bitstreams to test a bitstream decoder that is arranged to decode bitstreams generated in accordance with a predefined syntax. The method comprises the steps of generating test code from the syntax, the test code being arranged when executed to generate a test bitstream dependent on values assigned to a plurality of variables, each variable having a number of interesting values. The method then involves executing the test code, including the step of, for each of said variables, assigning that variable one of its interesting values, in order to thereby generate a test bitstream dependent on the interesting value assigned to each variable. It has been found that this technique provides an automated process for extensively testing a bitstream decoder.

12 Claims, 5 Drawing Sheets

TEST BIT-STREAM GENERATOR AND METHOD FOR DECODERS

BACKGROUND OF THE INVENTION

1. Field of the Invention

The present invention relates to a technique for generating test bitstreams to test bitstream decoders.

2. Description of the Prior Art

Bitstream decoders are generally designed to handle the decoding of bitstreams conforming to a predetermined format. The formats of particular types of bitstreams are typically defined in a fairly systematic manner. For example, the definition may take the form of a syntax defining the format and content of bitstreams generated in accordance with that syntax. This syntax may form part of a protocol relating to such bitstreams. For example, the MPEG-4 ISO-IEC Standard includes syntaxes defining the structure of audio and video bitstreams generated in accordance with the MPEG-4 Standard (see, for example, the ISO-IEC document ISO-IEC 14496-2:1999(E) entitled "Information Technology—Coding of Audio-Visual Objects—Part 2: Visual", which includes the syntax for video bitstreams conforming to the MPEG-4 Standard). In this example, the syntax is defined in pseudo-C, and a number of tables are provided defining the values that most variables referenced in that syntax can take.

When developing a bitstream decoder for a particular type of bitstream (eg. MPEG-4 video, MPEG-4 audio, etc), it is clearly necessary to perform certain testing of the bitstream decoder to ensure that it is correctly decoding bitstreams that it receives. Generally, this is done by generating a set of test bitstreams aimed at testing the completeness and robustness of the bitstream decoder. The typical prior art approach is to generate a set of test bitstreams on a case by case basis. This process has up to now been largely manual, and requires the developer of the test bitstreams to have both a good understanding of the bitstream standard, and code coverage measurements (i.e. a measurement of how much of the code under test has been exercised by the test data). The basic process is to start with a valid bitstream, and for as long as a component of the decoder has not been tested, to then edit an existing bitstream such that each untested decoder component is then exercised. This process will lead to the generation of a set of test bitstreams, which is deemed complete once each component of the decoder is considered to have been tested.

It is an object of the present invention to provide an improved technique for generating test bitstreams to test a bitstream decoder.

SUMMARY OF THE INVENTION

Viewed from a first aspect, the present invention provides a method of generating test bitstreams to test a bitstream decoder arranged to decode bitstreams generated in accordance with a predefined syntax, comprising the steps of: (a) generating test code from the syntax, the test code being arranged when executed to generate a test bitstream dependent on values assigned to a plurality of variables, each variable having a number of interesting values; (b) executing the test code, including the step of, for each of said variables, assigning that variable one of its interesting values, thereby generating a test bitstream dependent on the interesting value assigned to each variable.

In accordance with the present invention, it has been determined that it is possible to generate suitable test code from the syntax used to define the format and content of bitstreams. This test code can then be executed to exercise the syntax extensively, and thereby generate a set of test bitstreams which by their very nature will exercise the bitstream decoder extensively, given that the decoder should be robust enough to operate predictably upon receipt of any test bitstream conforming to the syntax.

For any particular test bitstream to be generated upon execution of the test code, values need to be assigned to a plurality of variables referenced within the test code. In accordance with the present invention, a number of "interesting values" are determined for each variable, and when executing the test code, each variable is assigned one of its interesting values, thereby generating a test bitstream dependent on the interesting value assigned to each variable.

It will be appreciated that this technique has application in any implementations where the syntax specification for the bitstream can be converted (by either automatic or manual editing, or a combination of both) into compilable code, which can then be executed to generate test bitstreams. The MPEG-4 audio and video Standards have syntaxes which define the format and contents of the bitstreams using pseudo-C, and a number of tables defining the meaning of variables, and the above approach has been found particularly effective in generating test bitstreams for MPEG-4 bitstream decoders. Nonetheless, it will be appreciated by those skilled in the art that this technique is clearly applicable to other bitstream definitions that also define the bitstream by an appropriate syntax.

It will be appreciated that the test code can be executed any number of times until an appropriate set of test bitstreams has been generated. In preferred embodiments, the execution of the test code is repeated until each variable has been assigned each of its interesting values, whereby a set of test bitstreams are generated. If all of the interesting values for any particular variable have been used, and a new value is required for that variable, additional interesting values can be generated in a number of ways to enable the full set of test bitstreams to be generated. For example, once all of the interesting values have been used for a particular variable, those interesting values may be reused, or any of the other legal values may be used. In preferred embodiments, additional interesting values are indexed using a pseudo-random sequence as and when required.

In preferred embodiments, each variable has a first set of interesting values for use in generating supported bitstreams supported by the bitstream decoder, and a second set of interesting values for use in generating unsupported bitstreams that are valid having regard to the syntax but not supported by the bitstream decoder, and the test code is executed to generate a set of supported test bitstreams and a set of unsupported test bitstreams.

Since the test code is generated from the syntax, then it is clear that it can be arranged to generate bitstreams that are legal having regard to the syntax, and indeed could be arranged to also generate bitstreams which are not valid according to the syntax. It is often the case that a decoder will only support a subset of the total possible bitstreams which may be generated in accordance with the syntax. Hence, having regard to bitstreams which are legal within the syntax, it is clear that there are two categories of bitstreams, namely supported bitstreams supported by the bitstream decoder, and unsupported bitstreams that are not supported by the bitstream decoder but are still valid having regard to the syntax. Hence, having regard to these two types of legal bitstream, each variable is preferably assigned a set of interesting values for use in generating supported bitstreams, and another set of interesting values for use in generating unsupported bitstreams. Further, if the test process is also to be used to test the robustness of the bitstream decoder against receipt of corrupted bitstreams (for example caused by bitstream transmission errors), then a third set of interesting values can be defined to enable illegal test bitstreams to be generated, i.e. bitstreams that are not valid according to the syntax.

The variables referenced by the test code may take a variety of forms. However, in preferred embodiments, at least one of the plurality of variables is defined by the syntax, and typically it is likely that most of the variables will be defined by the syntax.

Having regard to supported bitstreams, in preferred embodiments the bitstream decoder will support such syntax-defined variables having any value from a set of non-overlapping continuous ranges. Hence, a plurality of ranges may be specified for a particular variable, for example the variable may take any integer value in the ranges 0 to 2, 10 to 12, 20 to 25, etc. Alternatively, the set of ranges may include just a single range for a particular variable, e.g. the variable may have any value in the range 0 to 2. Finally, it should be noted that the term "range" as used herein does not necessarily imply a plurality of numbers, but additionally the range for a particular variable may merely comprise a single number. For example, the set of non-overlapping continuous ranges for a particular variable may include a first range consisting only of the integer 1, a second range consisting of any integer value between 5 and 10, etc, or indeed, a particular variable may be defined as having a constant value (i.e. its set of ranges consists of one range having a single value).

Given the possibility that each variable may have any value from a set of non-overlapping continuous ranges, it is clear that the "interesting values" may be determined in a number of ways. It would typically be impractical to allocate as interesting values all possible values of each variable, as that would lead to the generation of a very large number of test bitstreams. Hence, it is preferred that the interesting values are chosen so as to give a representative sample of values that each variable may take.

In preferred embodiments, when generating supported bitstreams supported by the bitstream decoder, the interesting values of each syntax-defined variable are the boundary cases of each range in the set. Further, if desired, the mid value of each range in the set can also be included as an interesting value.

With regard to unsupported bitstreams, the syntax and its associated definition of variables will define the absolute ranges of values that each variable can take, and given knowledge of the ranges supported by the decoder, the unsupported ranges can clearly be deduced. With regard to the choice of interesting values within these unsupported ranges, it is clear that any representative sample of those unsupported values could be chosen. However, in preferred embodiments, when generating unsupported bitstreams that are valid having regard to the syntax but not supported by the bitstream decoder, the interesting values of each syntax-defined variable are those values adjacent to, but outside of each range in the set of supported ranges.

With regard to illegal bitstreams, since the syntax and its associated definition of variables will define the absolute ranges of values that each variable can legally take, it can readily be deduced what values would be illegal values. With regard to the choice of illegal interesting values, it is clear that any representative sample of those illegal values could be chosen. However, in preferred embodiments, when generating illegal bitstreams that are not valid having regard to the syntax, the interesting values of each syntax-defined variable are those values adjacent to, but outside of each legal range.

In addition to variables that are defined by the syntax, in preferred embodiments at least one of the variables is an internal variable used to control execution of conditional operations within the test code. Examples of such conditional operations are loops where the number of times that the loop is executed will depend on particular conditions, "if" statements, etc. To control such conditional operations, additional variables are defined within the test code, and each time the test code is executed, these variables are assigned particular interesting values to control, for example, the number of times that the loop is executed, whether the "if" statement is invoked, etc.

In preferred embodiments, each internal variable may take any value within one or more ranges of values, and the interesting values for the internal variable are the boundary cases for each range. Preferably, the ranges for such internal variables are chosen to be legal within the syntax, and such that a desired number of test bitstreams are generated and the test bitstreams are of a desired length.

It is possible that, in some implementations, the interesting values could be generated "on the fly". However, in preferred embodiments, the method comprises the step of generating one or more tables containing the interesting values of each variable, such that at the time an interesting value needs to be assigned to the variable, this can be done via a lookup process to the relevant table.

Viewed from a second aspect, the present invention provides a test bitstream generator for generating test bitstreams to test a bitstream decoder arranged to decode bitstreams generated in accordance with a predefined syntax, comprising: a processor arranged to execute test code generated from the syntax, the test code being arranged when executed to generate a test bitstream dependent on values assigned to a plurality of variables, each variable having a number of interesting values; value determination means, responsive to execution of the test code, to assign to each variable one of said interesting values; whereby a test bitstream is generated dependent on the interesting value assigned to each variable.

Viewed from a third aspect, the present invention provides a computer program operable to configure a processing unit to perform a method of generating test bitstreams in accordance with the first aspect of the present invention. The present invention also provides a carrier medium comprising a computer program in accordance with the third aspect of the present invention.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

For the purposes of describing a preferred embodiment of the present invention, a test bitstream generator will be described for generating test bitstreams for an MPEG-4 video bitstream decoder, although it will be apparent that the technique of the preferred embodiment is equally applicable to many other types of bitstreams. As mentioned earlier, the syntaxes used by MPEG audio and video Standards are defined using pseudo-C and a number of tables which define the meaning of variables referenced in the syntax. It has been found that such syntax specifications can be converted (by a combination of automatic and manual editing) into compilable test code, which can then be executed so as to generate test bitstreams.

When the test code is executed, variables need to take on values in order to:
be inserted into the bitstream;
represent internal state of the syntax; and
control conditional execution (loops, "if" statements, etc).

In accordance with the preferred embodiment of the present invention, all of the above types of variable are controlled by a single class of variable (although it will be appreciated that this is not essential). Each time a variable needs to be assigned a new value (according to the syntax), the test code is arranged to update that value with an interesting value by a function call inserted into the pseudo-C. Conditions/loops will pass or fail under the control of additionally created variables, which take on new interesting values before each condition/loop.

By taking this approach, with repeated calls to the syntax, eventually all variables will have taken on all of their interesting values, and in preferred embodiments bitstream generation then terminates. At this stage, a set of test bitstreams will have been generated for thoroughly testing the bitstream decoder.

It should be noted that since the generation of bitstreams is completely deterministic (pseudo-random number generation may be used), the bitstreams may be generated "on the fly" with no requirement to archive them.

Figure 1:
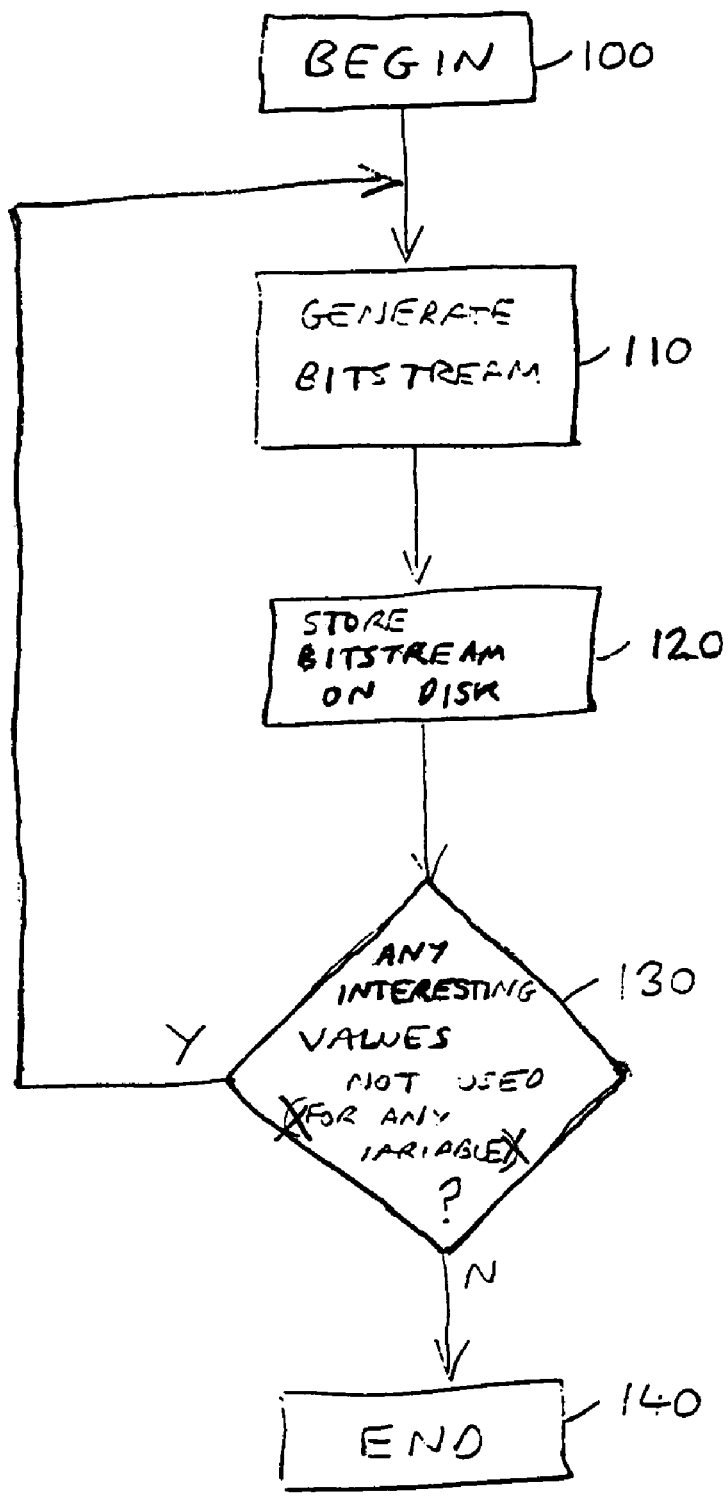
FIG. 1 is a flow diagram illustrating the process used in preferred embodiments to generate a set of test bitstreams.

FIG. 1 is a flow diagram providing an overview of the process performed by the test code of the preferred embodiment of the present invention.

The process begins at step 100, and proceeds to step 110, where a bitstream is generated by executing the test code. This process will be described in more detail later with reference to FIGS. 2 and 3, and results in the generation of a single bitstream, which is then stored, for example to a disk drive, at step 120. In preferred embodiments, the storage to disk actually happens as the bitstream is generated.

The test code is arranged to keep track of the interesting values that have been used when generating test bitstreams, and at step 130 it is determined whether any interesting values for any variable have not yet been used. If there are any interesting values which have not been used, the process returns to step 110, to cause a further test bitstream to be generated. However, once all of the interesting values for all variables have been used, the process then proceeds to step 140, where it terminates. At this point, a set of test bitstreams will have been generated for testing the bitstream decoder.

Figure 2:
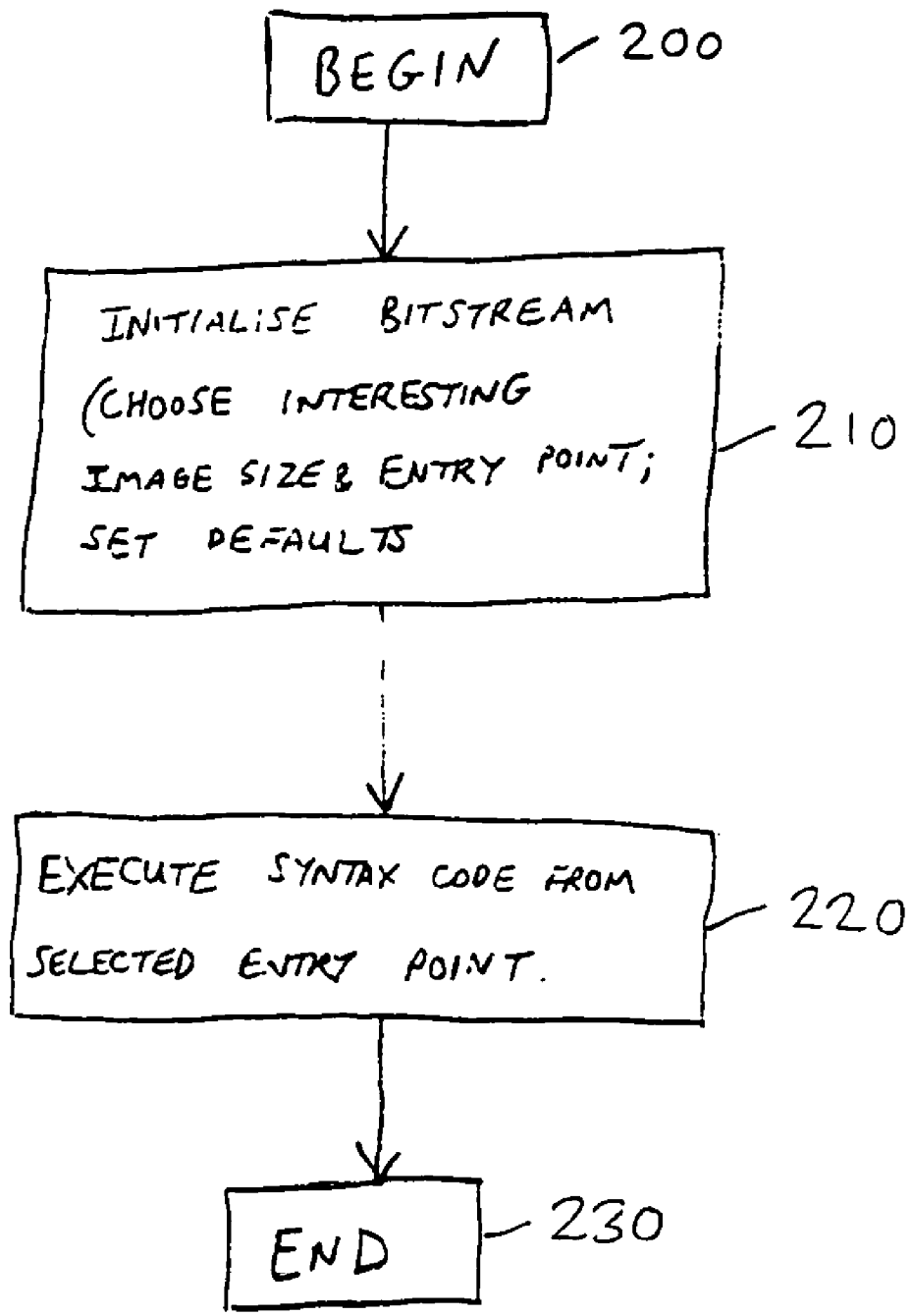
FIG. 2 is a flow diagram illustrating the process used to create a test bitstream in accordance with preferred embodiments of the present invention.

The process for generating a test bitstream (step 110 in FIG. 1) will now be discussed in more detail with reference to FIGS. 2 and 3. As shown in FIG. 2, the process begins at step 200, and proceeds to step 210, where an initialisation step is performed to initialise the bitstream. As part of this process, an interesting image size and entry point is determined and defaults are set for certain variables, this being done with reference to the allowed values specified in the text and tables of the relevant Standard.

The process then proceeds to step 220, where syntax code forming part of the test code is executed from the selected entry point. This process will be discussed in more detail later with reference to FIG. 3. Once it has been determined that the end of the syntax has been reached, the process terminates at step 230.

In preferred embodiments, the test code consists of a number of functional elements arranged to perform particular tasks. FIG. 3 is an interaction diagram illustrating various functional elements of the test code employed in preferred embodiments of the present invention, and some of the interactions between those elements. It should be noted that, for clarity reasons, not all interactions are shown. The arrows indicate messages from a calling to a called element of the test code, and the arrow labels are purely illustrative, i.e. typical messages passing between the functional elements.

Figure 3:
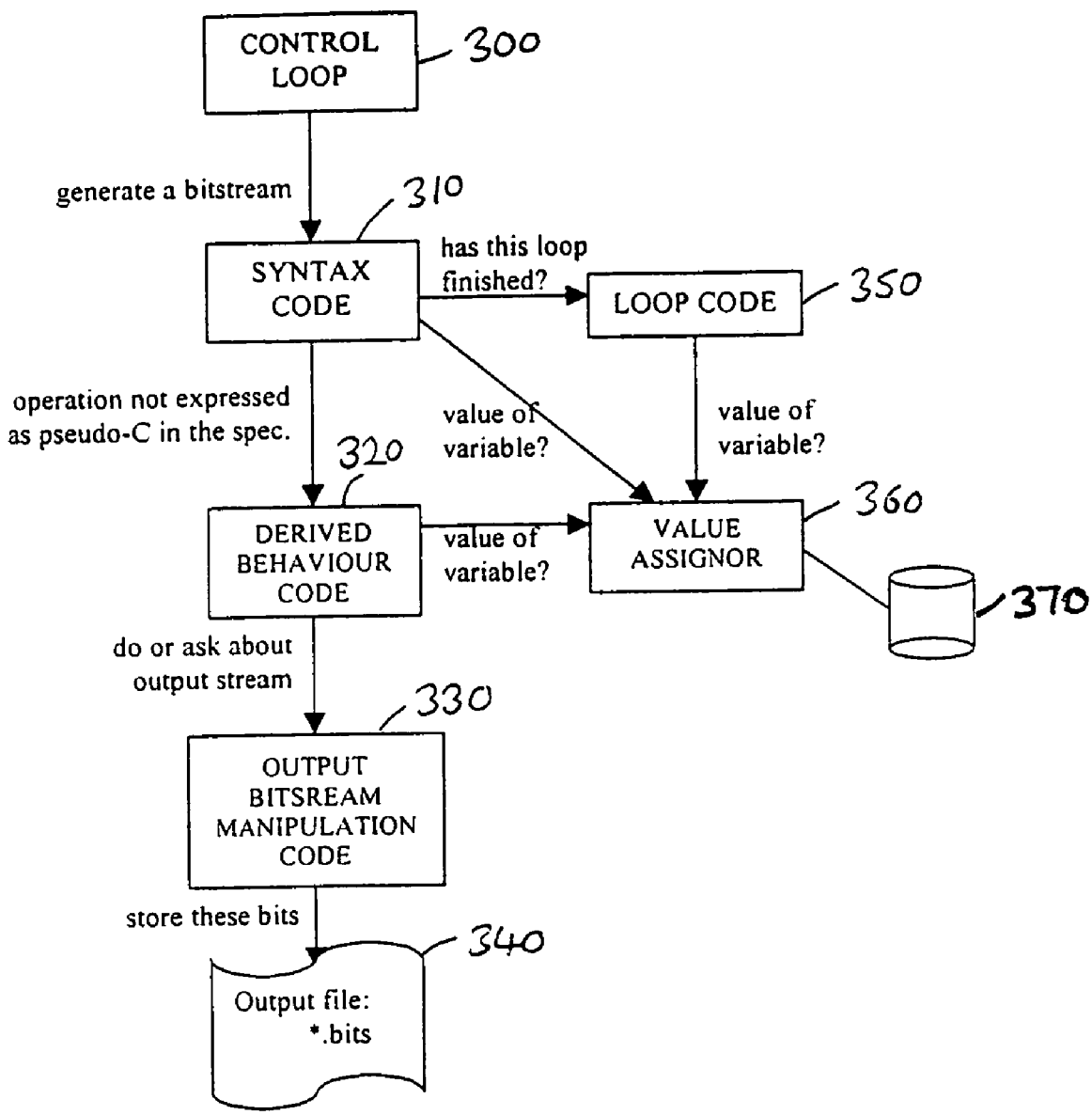
FIG. 3 is an interaction diagram illustrating various functional elements of the test code employed in preferred embodiments of the present invention, and some of the interactions between those elements.

With reference to FIG. 3, a main control loop 300 is provided, which basically controls the number of times that the syntax code is executed to generate a test bitstream. Each time a test bitstream is to be generated, the control loop 300 will send a message to the syntax code 310. The syntax code 310 is the code developed directly from the pseudo-C version of the MPEG-4 video syntax. In addition to the basic syntax code 310, some derived behaviour code 320 is also provided to deal with certain MPEG-4 behaviour which is not expressed as pseudo-C in the MPEG-4 video syntax. The derived behaviour code is derived from the specification text of the MPEG-4 Standard, and is referenced by the syntax code 310 to deal with operations not expressed as pseudo-C in the MPEG-4 syntax.

Whenever a new value for a variable is required, then the code 310 or 320 will issue a message to the value assignor code 360 requesting that the variable be assigned a particular interesting value. In preferred embodiments, a number of tables are provided in a storage 370, which contains for each variable a number of interesting values that that variable may take. Hence, typically, the value assignor 360 will reference the storage 370 in order to determine a new interesting value for a variable as and when required. The value assignor 360 also keeps track of the interesting values used for each variable, so that it can determine when all interesting values have been used for that variable.

However, there will typically be a number of variables for which it is not appropriate to predefine a set of interesting values within a table. For such variables the value assignor 360 is arranged to invoke some predetermined code to deal with the generation of interesting values.

Since the MPEG-4 video syntax is defined in terms of how the decoder must operate, the MPEG-4 video bitstream syntax is not entirely causal. The number of loop iterations is often controlled by looking ahead in the bitstream to see if any more data needs decoding by the current loop. In preferred embodiments of the present invention, the test bitstream generator works around this problem by controlling loops using internal variables which are made to take on interesting values in the same way that other variables do. More specifically, with reference to FIG. 3, loop code 350 is provided to control such conditional operations, such as loops and "if" statements. Hence, whenever the syntax code 310 identifies such a conditional operation, it sends a message to the loop code 350. The loop code 350 then references the value assignor code 360 requesting an interesting value for the internal variable inserted into the code to control the conditional operation.

Once the syntax code 310 and the derived behaviour code 320 has been executed, with interesting values being assigned to the variables by the value assignor code 360 as and when required, this results in the generation of a test bitstream. An output bitstream manipulation code 330 is provided to perform certain operations on the output test bitstream, for example byte alignment operations, etc. Once the output bitstream has been manipulated as required, then the output bitstream is stored in a file 340. Hence, once all of the variables have taken on all of their interesting values, this will result in a set of test bitstreams being stored in the output file 340, which can then be used to thoroughly test the bitstream decoder.

In preferred embodiments, each variable may have any value from a set of non-overlapping continuous ranges, and accordingly it is clear that the "interesting values" may be determined in a number of ways. Preferably, the interesting values are chosen so as to give a representative sample of values that each variable may take.

Any one bitstream decoder is unlikely to support the whole syntax, so each variable will in preferred embodiments have a supported and unsupported/illegal ranges. Supported and unsupported bitstreams are preferably generated separately. The generation of unsupported and/or illegal test bitstreams is useful, since, for example, a particular bitstream decoder which supports only certain parts of the syntax should not fall over when it receives unsupported or illegal bitstreams.

Hence, considering one variable, it will be apparent that it will have a range of values that it can take. Some of these values are legal, some are not. Of those that are legal, some are supported and some are not. The whole range can be broken down into continuous non-overlapping regions which fall into one of three classes:

SUPPORTED: legal and not unsupported

UNSUPPORTED: legal and not supported

ILLEGAL: not legal

The interesting SUPPORTED values are the end (and mid) points for each of the continuous SUPPORTED ranges.

Similarly, the interesting UNSUPPORTED values are the end (and mid) points for each of the continuous UNSUPPORTED ranges.

Similarly, the interesting ILLEGAL values are the end (and mid) points for each of the continuous ILLEGAL ranges.

To take an example, if a variable can vary from 0 to 255 (because the syntax defines it as 8 bits in the bitstream), then it might be legal from 100 to 150 and supported from 120 to 130.

The non-overlapping continuous ranges are thus:

0–99: illegal

100–119: unsupported

120–130: supported

131–150: unsupported

151–255: illegal

So in preferred embodiments the interesting values would be something like:

illegal: 0,45,99,151,200,255 unsupported: 100,110,119,131,140,150 supported: 120,125,130

Figure 4:
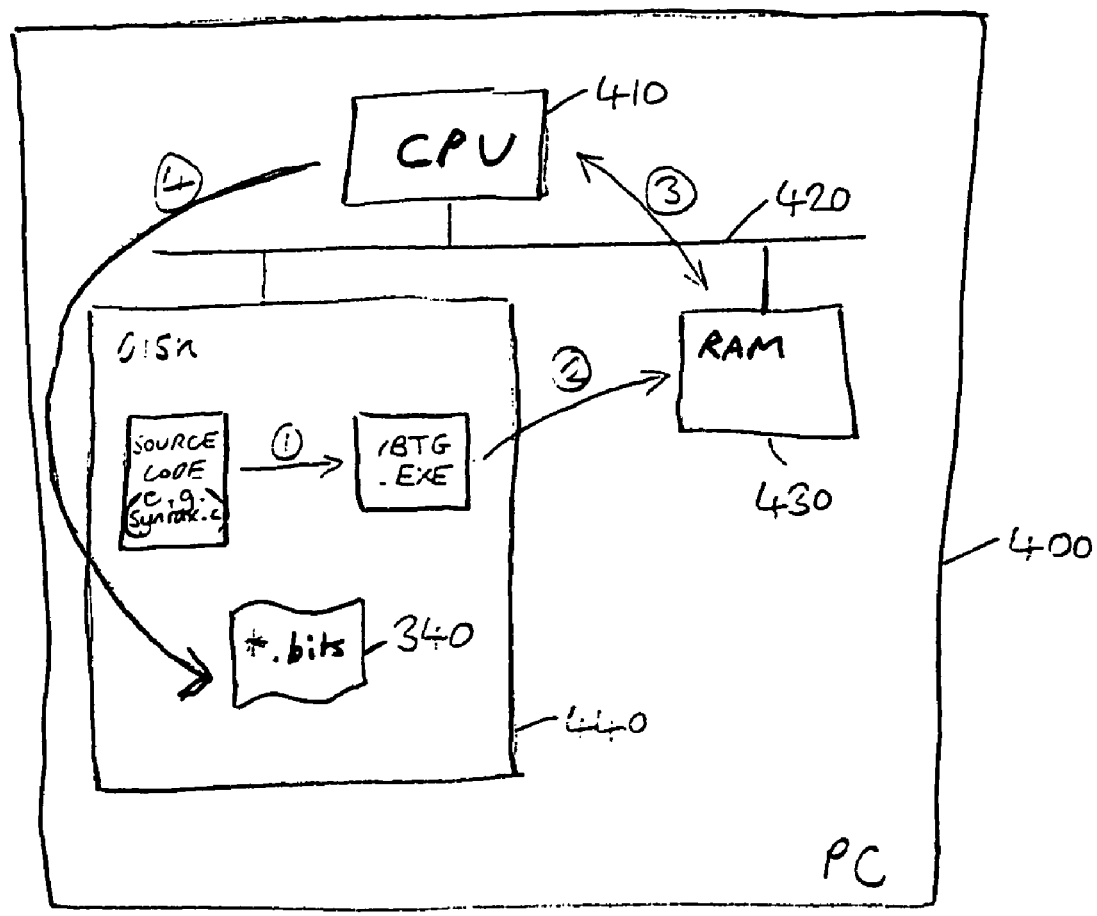
FIG. 4 is a diagram schematically illustrating how the test bitstream generation process may be executed on a computer system.

It will be appreciated that the test code generated in accordance with preferred embodiments of the present invention may be arranged to operate on any suitable hardware. FIG. 4 illustrates one example of an implementation, where the test code is arranged to execute on a personal computer (PC) 400. Within a typical PC 400, a Central Processing Unit (CPU) 410 is connected by a bus 420 with a hard disk drive 440 and Random Access Memory (RAM) 430. In preferred embodiments, the test source code is stored on the hard disk drive. As a first step, this source code can be compiled into the executable test code referenced in FIG. 4 as VBTG.EXE. The executable test code is then loaded from the hard drive 440 into the RAM 430, from where it is executed by the CPU 410. As each test bitstream is generated, the CPU 410 will write the test bitstreams back to a file 340 within the hard disk drive 440.

Having discussed the preferred embodiment of the present invention with reference to FIGS. 1 to 4, an additional description of a preferred embodiment is now provided in the following document entitled Video Bitstream Test Generator (VBTG) Design.

Video Bitstream Test Generator (VBTG) Design

Contents

1 About this document 1.1 Terms and abbreviations

2 Introduction 2.1 Strategy

3 Design
  3.1 Terminology
  3.2 Operation
  3.3 "Interesting" Values
  3.4 Bitstreams to be Generated 4 Implementation
  4.1 Source of the Source Code
  4.2 Module Breakdown
  4.3 Control of Parameter Variation
    4.3.1 Top Level Parameter Control
    4.3.2 Range Control
    4.3.3 Range Tables
    4.3.4 Corner cases and beyond 1 About this document 1.1 Terms and abbreviations This document uses the following terms and abbreviations.

| Term | Meaning |
| --- | --- |
| ILLEGAL | Variable values not allowed within the MPEG-4 visual syntax. |
| MPEG-4 | Motion Picture Experts Group video-stream standard. |
| SUPPORTED | Variable values supported by a decoder and legal with the MPEG-4 visual syntax. |
| UNSUPPORTED | Variable values not supported by a decoder, but legal with the MPEG-4 visual syntax. |
| VBTG | Video Bitstream Test Generator |
| VLC | Variable Length Code |

2 Introduction

2.1 Strategy

The format and contents of MPEG-4 video bitstreams are defined by ISO-IEC document ISO-IEC 14496-2:1999(E) entitled "Information Technology—Coding of Audio-Visual Objects—Part 2: Visual" in a fairly systematic manner. The syntax is defined in pseudo-C and numerous tables define the values that most variables can take. Previous test strategies have been to generate test vectors (bitstreams) manually, or to write a bitstream generator from scratch. For the MPEG-4 video, the pseudo-C will be used to generate test bitstreams automatically so as to provide very thorough test coverage. Note that the automatically generated bitstreams will not represent visually meaningful video sequences.

3 Design

3.1 Terminology

Three classes of bitstream will be generated by the VBTG:

| | |
| --- | --- |
| SUPPORTED: | Bitstreams supported by the client's decoder. |
| UNSUPPORTED: | Bitstreams which are legal within the syntax, but which are not SUPPORTED. |
| ILLEGAL: | Bitstreams which are not valid according to the syntax. |

For example, a decoder which only SUPPORTs the simple profile should not fall over whatever bitstream it receives—it should be robust. The UNSUPPORTED class of bitstreams will be used to prove robustness against higher level profiles. The ILLEGAL class of bitstreams will be used to prove robustness against corrupted bitstreams (e.g. caused by bitstreams transmission errors).

3.2 Operation

The reference encoder source code supplied by ISO/IEC could be used to generate bitstreams. These bitstreams could be produced by varying options within the configuration file and generating interesting input image sequences. However, the output would never be ILLEGAL. To generate ILLEGAL boundary cases from the reference code would require a large number of modifications to the encoder.

Rather than run the reference code, the pseudo-C syntax within the standard can be converted to C source. The syntax is mainly procedural, so a single call to an entry point (see section 6.2.1 of ISO-IEC document ISO-IEC 14496-2:1999 (E) entitled "Information Technology—Coding of Audio-Visual Objects—Part 2: Visual") generates a bitstream. The bitstream which is generated depends on:—

- the entry point chosen (between 3 and 5 possible entry points depending on the profile);
- the success or failure of conditions (while loops and if statements);
- the values adopted by variables carrying data for the bitstream (such as DCT coefficients);
- the values adopted by variables which hold the state of the encoder.

All of the above can be controlled by a single class of variable. Each time a variable needs to change value (according to the syntax), it will be updated to an interesting value ("interesting" defined below) by a function call inserted into the pseudo-C. Conditions/loops will pass or fail under control of specially created variables which take on new "interesting" values before each loop or if statement.

There are interactions between these variables which are described by the pseudo-C and are therefore already handled. There are also interactions which are embedded elsewhere in the text of the standard. These are handled by additional code.

3.3 "Interesting" Values

Generating the tables which specify how variables should be varied involves consideration of the following factors.

- Some variables are constants defined by the syntax (e.g. start codes).
- Some variables have only one value supported by the client's decoder.
- Most variables take any of a range of values (whether a number or a Variable Length Code (VLC)).

The "interesting" values are the boundary cases for number ranges, and all possible values for VLCs.

3.4 Bitstreams to be Generated

Consider a decoder which implements every option within the MPEG4 specification. In order to test a large fraction of the code and boundary cases in this decoder, a large number of test cases are required. Ideally, the number of bitstreams (the number of test vectors) would be kept small. For SUPPORTED bitstreams, this might be possible. However, for UNSUPPORTED and ILLEGAL cases any one test could cause the decoder to partially or completely abort the decoding process, so each test case should (ideally) be within a separate bitstream file. The bitstream should be generated until a new UNSUPPORTED/ILLEGAL value is introduced, and then continued to completion at the first opportunity allowed by the syntax.

For example, the algorithm to test how a decode copes with UNSUPPORTED values might be something like:

initialise all variables ready to run through their UNSUPPORTED range do

```
{
    generate_new_bitstream( )
```

-continued

```
    test decoders with bitstream
}
while (any UNSUPPORTED variable has not used all its "interesting" values)
generate_new_bitstream( )
{
    initialise bitstream
    generate bits until any variable takes on a new UNSUPPORTED value
    continue generating with SUPPORTED data until the end of frame
}
```

4. Implementation

4.1 Source of the Source Code

The pseudo-C from the March 1998 specification was pasted into a text file and processed with raw2mid.pl to be more C-like for which there is no documentation beyond the in-file comments. Manual editing was then necessary to get it into a form which compiles and links as C. Further manual editing updated the source to match the December 1999 release of the specification, but only as far through as the alpha_block( ) function. The remainder have assert(FALSE) calls to make sure they are not used until they have been updated.

4.2 Module Breakdown

Figure 5:
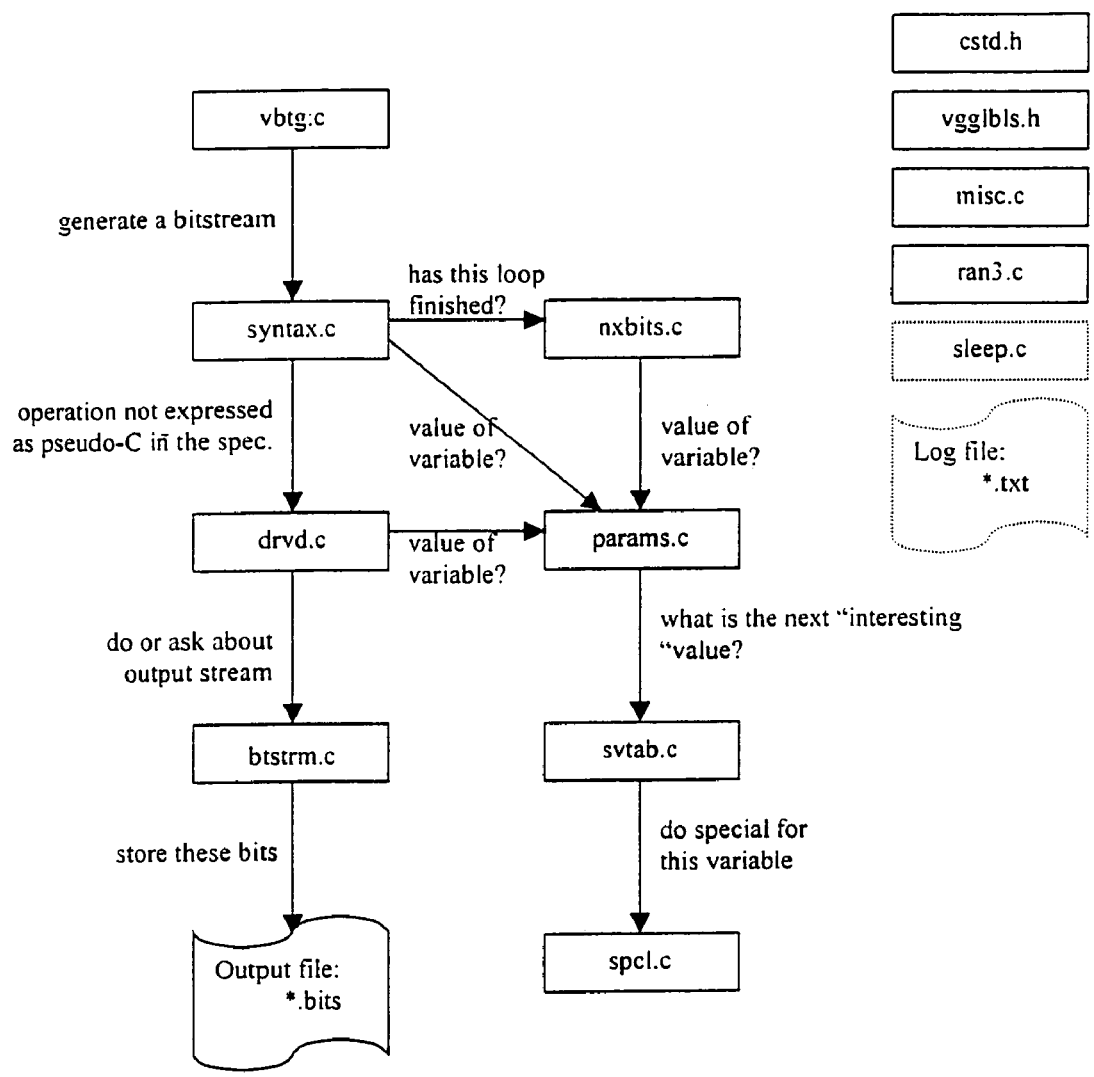
FIG. 5 is an interaction diagram illustrating various modules of the test code employed in preferred embodiments of the present invention, and some of the interactions between those elements.

FIG. 5 shows an outline of the VBTG module structure. Not all interactions are shown. Arrows are from calling to called party. Arrow labels are purely illustrative—typical messages passing between modules. A list of all modules and their purposes is given in Table 1. The project code prefix of "vg" indicates PUBLIC header files (as opposed to PRIVATE to that module).

TABLE 1

VBTG Files/Modules

| Filename(s) | Description |
|---|---|
| cstd.h | Definitions from the ARM SoftSys C coding standard [Document No SSB00 WKIN 0001 B]. |
| Vgglbls.h | Global variable definitions/declarations. Mostly variables defined in the MPEG-4 syntax. |
| vbtg.c, vgvbtg.h | main( ). Currently causes a single bitstream to be generated. Will eventually coordinate the generation of bitstreams, operating on the bitstreams with decoders and logging the results. |
| syntax.c, syntax.h, vgsyntax.h | MPEG-4 video syntax from the pseudo-C version in the MPEG-4 specification. Highest level procedures are at the top of the file. Procedures which have not been updated to match the Dec1999 specification have assert(FALSE) inserted at the start. |
| synxbits.c, synxbits.h, vgnxbits.h | nextbits( ) and nextbits_aligned( ) calls from the syntax implemented to make loop iterate an "interesting" number of times. Implementation shares params.c with normal (non-loop) syntax variables. |
| drvd.c, vgdrvd.h | Some MPEG-4 behaviour is not expressed as pseudo-C in the specification, but are "derived" from the specification text. |
| btstrm.c, vgbstrm.h | Operations on the output bitstream (including enquiries about the state of the output stream such as byte alignment). |
| ptabs.c | Tables of initialised data for params.c. This file is #included by params.c. The two are separate merely in order split the large module into two files. The unusual step of including a .c file was taken so that a very large file was avoided, the initialised data and access functions still formed a single C module, and the generation of a header file to link two modules was unnecessary. |
| params.c, params.h, | Variables need to take on "interesting" values as the bitstreams are generated. This module contains: |

TABLE 1-continued

VBTG Files/Modules

| Filename(s) | Description |
|---|---|
| vgparams.h | (1) (In ptabs.c) a table with one row per variable specifying how each variable should vary in supported, legal and illegal ways. Tables of parameter ranges are referenced (see (2) below). Also, when special cases exist, special (see special.c) handler functions are referenced. |
| | (2) (In ptabs.c) tables define the ranges of values which a variable might take. Typically these tables correspond to tables in the MPEG-4 specification. |
| | (3) Access functions to the above tables. |
| svtab.c, vgsvtab.h | In params.c a table is selected from which to fetch the new "interesting" value of a variable. The function svtab.c performs this lookup (possibly including decode by calls into special.c). |
| spcl.c, vgspcl.h | When the row of a table has been selected for a variable, the process of decoding the meaning of the BVT_Specials[ ] string is specific to the variable in question. If a non-NULL pointer to a function is provided in rSpecialsHandler field of the current sSyntaxVariable structure, then it is called to perform this decode. |
| ran3.c, vgran3.h | Random number generator, based on ran3( ) from Numerical Recipes in C. Modified to be integer only, and to allow peeking of the next value. |
| misc.c, vgmisc.h | Miscellaneous functions. |
| sleep.c | Required for Windows only: sleep( ) implementation. |
| readme.txt | Implementation notes. E.g. C Coding Standard exceptions. |
| *.bits | Output file which conforms to the MPEG-4 syntax, but doesn't represent visually meaningful image sequences. |
| *.res | One line of text recording the sequences width and height. The same information is contained within the bitstream. |
| *.txt | Optional output file which contains a listing of how the bitstream was generated. |

4.3 Control of Parameter Variation

4.3.1 Top Level Parameter Control

Syntax variables must be made to take on "interesting" values, and a record must be kept of which "interesting" values are yet to be used. This is controlled by the params.c (with #included ptabs.c) module.

The table sSyntaxVariableTable[ ] within params.c has one entry per syntax variable. Each variable exists as a C global int (see vgglbls.h), and is also identified by the ASCIIZ string form of their C identifier. sSyntaxVariableTable[ ] stores:

- the string-form identifier;
- the address of the global variable;
- an optional pointer to a "specials" handler (see 4.3.3);
- three structures defining the SUPPORTED, UNSUPPORTED and ILLEGAL ranges which the variable should vary over. See section 4.3.2.

Access to sSyntaxVariableTable[ ] is via access functions within params.c. Normally, when a variable is accessed, the new "interesting" value is set in the global variable, any "specials" (side effects) are enacted, and the new "interesting" value is marked as used. Options allow variations:

If fPeekOnly is TRUE then the new "interesting" value is not marked as used. This allows control of the interaction between parameter values without requesting values which cannot then be used in the bitstream.

If fNewValue is FALSE then the previous value is left untouched.

4.3.2 Range Control

The sVariableRange structure defines the "interesting" values which a variable should take in one of the SUPPORTED, UNSUPPORTED and ILLEGAL classes. The following are stored:

an enum defining the meaning of this instance of this structure (eRangeType);

a pointer to a table of "interesting" values—see section 4.3.3;

an index into the above table. That is, which "interesting" values have been used;

whether none, some or all "interesting" values have been used. That is, whether the next value should come from the start of the table, somewhere in the middle, or (because all values have been used at least once) from a random point in the table;

There are special cases (where eRangeType is not RT_TABLE) such as:

when the variable is a constant (so the I_NITIALISED( ) value from vgglbls.h is always used);

when the variable's behaviour is too complex to be represented in a table as above, so dedicated handler code is triggered in the access functions—RT_HANDLER. Handler code is in params.c.

4.3.3 Range Tables

The vgPARAMS_sBitValueTable[ ] tables (see the top of params.c) have one row per continuous range of values which a variable can take. Two parameters control the indexing of interesting values. The first string parameter gives the range of values for the variable to take. The second string parameter optionally contains "specials" information which is normally decoded by the variable's "specials" handler function in spcl.c.

4.3.4 Corner cases and beyond

The corner cases are the beginning, middle and end of each row in the range tables. Once all corner cases have been exhausted, further "interesting" values are indexed using a pseudo-random sequence. Each variable has a separate sequence initialised to a different initial seed.

For the interested reader, there is provided below a representative part of the code "syntax.c" referenced in FIG. 5. In the following code, the function "PUBLIC void vgSYNTAX_EntryPoint( . . . )" shows how the file interfaces to the control loop (vbtg.c). In other words, this function shows how to get started using the syntax.

In the remainder of the code, the functions starting "FUNCTION_ARG . . . ( )" are examples of how the MPEG-4 syntax (the pseudo-C) was converted into C in accordance with the preferred embodiments of the present invention.

```
/*
* syntax.c $Revision: 1.42 $
* Copyright © ARM Limited 2000. All rights reserved.
*
* The MPEG-4 syntax pseudo-C converted to C.
*/
/*
* Description:
* Public interface to the MPEG-4 visual syntax
*
* Remarks:
* All syntax procedures are PRIVATE to this module.
* This is the only way in.
*
* Inputs:
* none
*
* Outputs:
* none
*
* Return Value:
* none
*/
PUBLIC void vgSYNTAXEntryPoint(void)
{
    vgTime_SetTimeInTicks(0);
    EncodingFramesPerSecond = 15;
    /* Reset flags which default to zero. The next interesting value */
    /* is not affected.                                               */
    opaque = transparent = intra_cae = inter_cae = no_update =
    upsampling = intra_blocks = inter_blocks = inter4v_blocks =
    not_coded_blocks = dct_coefs = dct_lines = vlc_symbols = vlc_bits =
    apm = npm = interpolate_mc_q = forw_back_mc_q = halfpel2 = halfpel4 =
    0;
    /* Choose the image size for the whole of this bitstream */
    vgPARAMS_NextValue("short_video_header", FALSE);
    if(short_video_header)
```

```
        {
            vgPARAMS_NextValue("source_format", FALSE);
        switch(source_format)
        {
        case 1:
            video_object_layer_width=128;
            video_object_layer_height=96;
            break;
        case 2:
            video_object_layer_width=176;
            video_object_layer_height=144;
            break;
        case 3:
            video_object_layer_width=352;
            video_object_layer_height=288;
            break;
        case 4:
            video_object_layer_width=704;
            video_object_layer_height=576;
            break;
        case 5:
            video_object_layer_width=1408;
            video_object_layer_height=1152;
            break;
        default:
            assert(FALSE);
        }
        /* Defaults for short headers from Table 6–24 */
        video_object_layer_shape =
VIDEO_OBJECT_LAYER_SHAPE_RECTANGULAR;
        obmc_disable = 1;
        quant_type = 0;
        resync_marker_disable = 1;
        data_partitioned = 0;
        block_count = 6;
        reversible_vlc = 0;
        VOP_rounding_type = 0;
        VOP_fcode_forward = 1;
        VOP_coded = 1;
        interlaced = 0;
        complexity_estimation_disable = 1;
        /*  use_intra_dc_vlc = 0 */
            intra_dc_vlc_thr = 0;
        scalability = 0;
        not_8_bit = 0;
            bits_per_pixel = 8;
            colour_primaries = 1;
            transfer_characteristics = 1;
            matrix_coefficients = 6;
        }
        else
        }
            vgPARAMS_NextValue("video_object_layer_width", FALSE);
            vgPARAMS_NextValue("video_object_layer_height", FALSE);
        }
        vgVBTG_PrintfLog("Setting VOP_width and VOP_height from VOL
dimensions\n");
        VOP_width = video_object_layer_width;
        VOP_height = video_object_layer_height;
        /* Tell the test harness how big the image to decode is */
        vgVBTG_RecordResolution(video_object_layer_width,
                video_object_layer_height);
        vgVBTG_AlwaysPrintfLog("Pixel resolution: %d %d\n",
                video_object_layer_width,
                video_object_layer_height);
        /* Enter at a suitable interesting point */
        if(short_video_header)
        {
            vgPARAMS_NextValue("short_video_header_entry_point", FALSE);
            switch(short_video_header_entry_point)
            {
            case 0:
                VisualObjectSequence( );
                break;
            case 1:
                video_plane_with_short_header( );
                break;
            default:
                assert(FALSE);
```

-continued

```
            }
        }
        else
        {
            vgPARAMS_NextValue("non_short_video_header_entry_point", FALSE);
            switch(non_short_video_header_entry_point)
            {
            case 0:
                VisualObjectSequence( );
                break;
            case 1:
                /* Reference decoder only accepts this . . . */
                VideoObject( );
                break;
            case 2:
                VideoObjectPlane( );
                break;
            default:
                assert(FALSE);
            }
        }
    }
}
/************************************************************************
*
*
* MPEG-4 visual syntax follows.
* See spec for the meaning of each procedure.
*
* Comments have been added where modifications have been made.
*
************************************************************************
/
/* 5.2.4 */
FUNCTION_0ARGS(next_start_code)
{
    /* Spec is ambiguous (pseudo-C contradicts text). */
    /* Decision: believe the text not the pseudo-C */
#if ARM_BYTEALIGN_IN_NEXTSTARTCODE
    if(!bytealigned( ))
#endif
    {
        INSERT(zero_bit, "1", "bslbf");
        while (!bytealigned( ))
            INSERT(one_bit, "1", "bslbf");
    }
}
/* 5.2.5 */
FUNCTION_0ARGS(next_resync_marker)
{
    next_start_code( );
}
/* 6.2.2 Visual Object Sequence and Visual Object */
FUNCTION_0ARGS(VisualObjectSequence)
{
    INSERT(visual_object_sequence_start_code, "32", "bslbf");
    INSERT(profile_and_level_indication, "8", "uimsbf");
    while (nextbits("VisualObjectSequence1")==user_data_start_code)
    {
        user_data( );
    }
    VisualObject( );
    INSERT(visual_object_sequence_end_code, "32", "bslbf");
}
/* This function is not in DEC99 specification, but was split out */
/* from VisualObject( ) to support the DEC99 reference code.      */
void VideoObject(void)
{
        /* 5 least significant bits specify video_object_id value */
        INSERT(video_object_start_code, "27", "bslbf");
        INSERT(video_object_id,    "5", "bslbf");
        VideoObjectLayer( );
}
FUNCTION_0ARGS(VisualObject)
{
    INSERT(visual_object_start_code, "32", "bslbf");
    INSERT(is_visual_object_identifier, "1", "uimsbf");
    if(is_visual_object_identifier)
    {
        INSERT(visual_object_verid, "4", "uimsbf");
```

-continued

```
        INSERT(visual_object_priority, "3", "uimsbf");
    }
    INSERT(visual_object_type, "4", "uimsbf");
    if(visual_object_type == VISUAL_OBJECT_TYPE_VIDEO_ID ||
visual_object_type == VISUAL_OBJECT_TYPE_STILL_TEXTURE_ID)
    {
        f_video_signal_type( );
    }
/* Order change only - see above */
    next_start_code( );
    while (nextbits("VisualObject1")==user_data_start_code)
    {
        user_data( );
    }
    if(visual_object_type == VISUAL_OBJECT_TYPE_VIDEO_ID)
    {
        VideoObject( );
    }
    else if(visual_object_type == VISUAL_OBJECT_TYPE_STILL_TEXTURE_ID)
    {
        StillTextureObject( );
    }
    else if(visual_object_type == VISUAL_OBJECT_TYPE_MESH_ID)
    {
        MeshObject( );
    }
    else if(visual_object_type == VISUAL_OBJECT_TYPE_FACE_ID)
    {
        /* Was "FaceObject( );" */
        fba_object( );
    }
    /* The syntax runs next_start_code if the next bits */
    /* are not a start code. This means we must exit    */
    /* byte aligned, so force byte alignment directly. */
    if(!bytealigned( )) /* was nextbits("VisualObject2") != 1) */
    {
        /* Insert bits to force alignment and assume next thing */
        /* which gets inserted will be a start/end code.    */
        next_start_code( );
    }
}
FUNCTION_0ARGS(f_video_signal_type)
{
    INSERT(video_signal_type, "1", "bslbf");
    if(video_signal_type)
    {
        INSERT(video_format, "3", "uimsbf");
        INSERT(video_range, "1", "bslbf");
        INSERT(colour_description, "1", "bslbf");
        if(colour_description)
        {
            INSERT(colour_primaries, "8", "uimsbf");
            INSERT(transfer_characteristics, "8", "uimsbf");
            INSERT(matrix_coefficients, "8", "uimsbf");
        }
    }
}
/* 6.2.2.1 User data */
FUNCTION_0ARGS(user_data)
{
    INSERT(user_data_start_code, "32", "bslbf");
    while (nextbits("user_data") != 0x000001)
    {
        INSERT(user_data_value, "8", "uimsbf");
    }
    next_start_code( );
}
```

Although a particular embodiment of the invention has been described herein, it will be apparent that the invention is not limited thereto, and that many modifications and additions may be made within the scope of the invention. For example various combinations of the features of the following dependent claims could be made with the features of the independent claims without departing from the scope of the present invention.

I claim:

1. A method of generating test bitstreams to test a bitstream decoder arranged to decode bitstreams generated in accordance with a predefined syntax, comprising the steps of:
   (a) generating test code incorporating the syntax, the test code being arranged when executed to generate a test bitstream dependent on values assigned to a plurality of variables, each variable having a number of interesting values;
   (b) executing the test code, including the step of, for each of said variables, assigning that variable one of its interesting values, thereby generating a test bitstream dependent on the interesting value assigned to each variable,
   wherein said step (b) is repeated until each variable has been assigned each of its interesting values, whereby a set of test bitstreams is generated.

2. A method as claimed in claim 1, wherein each variable has a first set of interesting values for use in generating supported bitstreams supported by the bitstream decoder, and a second set of interesting values for use in generating unsupported bitstreams that are valid having regard to the syntax but not supported by the bitstream decoder, and the test code is executed to generate a set of supported test bitstreams and a set of unsupported test bitstreams.

3. A method as claimed in claim 1, wherein at least one of said plurality of variables is defined by the syntax.

4. A method as claimed in claim 3, wherein the bitstream decoder supports said at least one variable having any value from a set of non-overlapping continuous ranges.

5. A method as claimed in claim 4, wherein, when generating supported bitstreams supported by the bitstream decoder, the interesting values of said at least one variable are the boundary cases of each range in the set.

6. A method as claimed in claim 4, wherein, when generating unsupported bitstreams that are valid having regard to the syntax but not supported by the bitstream decoder, the interesting values of said at least one variable are those values adjacent to, but outside of each range in the set.

7. A method as claimed in claim 1, wherein at least one of the variables is an internal variable used to control execution of conditional operations within the test code.

8. A method as claimed in claim 7, wherein each internal variable may take any value within one or more ranges of values, and the interesting values for the internal variable are the boundary cases for each range.

9. A method as claimed in claim 1, further comprising the step of generating one or more tables containing the interesting values of each variable.

10. A test bitstream generator for generating test bitstreams to test a bitstream decoder arranged to decode bitstreams generated in accordance with a predefined syntax, comprising:
    a processor arranged to execute test code incorporating the syntax, the test code being arranged when executed to generate a test bitstream dependent on values assigned to a plurality of variables, each variable having a number of interesting values;
    value determination means, responsive to execution of the test code, to assign to each variable one of said interesting values;
    whereby a test bitstream is generated dependent on the interesting value assigned to each variable, and
    wherein the processor is arranged to execute the test code respectively until each variable has been assigned each of its interesting values, whereby a set of test bitstreams is generated.

11. A computer program embodied in a computer-readable medium for configuring a processing unit to perform a method of generating test bitstreams as claimed in claim 1.

12. A computer-readable carrier medium encoded with the computer program as claimed in claim 11.

* * * * *